United States Patent
Yang et al.

(10) Patent No.: US 11,467,223 B2
(45) Date of Patent: Oct. 11, 2022

(54) DEVICE AND METHOD FOR SIMULATING INTERMITTENT ARC GROUNDING FAULTS OF POWER DISTRIBUTION NETWORK

(71) Applicant: State Grid Hubei Electric Power Research Institute, Hubei (CN)

(72) Inventors: Fan Yang, Hubei (CN); Yu Shen, Hubei (CN); Wanting Deng, Hubei (CN); Zhichun Yang, Hubei (CN); Yang Lei, Hubei (CN); Yao Yao, Hubei (CN); Lei Su, Hubei (CN); Wei Hu, Hubei (CN); Wei Jiang, Hubei (CN); Zeyang Tang, Hubei (CN); Fangbin Yan, Hubei (CN)

(73) Assignee: State Grid Hubei Electric Power Research Institute, Wuhan (CN)

( * ) Notice: Subject to any disclaimer, the term of this patent is extended or adjusted under 35 U.S.C. 154(b) by 16 days.

(21) Appl. No.: 17/084,451

(22) Filed: Oct. 29, 2020

(65) Prior Publication Data

US 2021/0208209 A1 Jul. 8, 2021

Related U.S. Application Data

(63) Continuation-in-part of application No. PCT/CN2020/101994, filed on Jul. 15, 2020.

(30) Foreign Application Priority Data

Jan. 2, 2020 (CN) .......................... 202010001173.0

(51) Int. Cl.
*G01R 31/58* (2020.01)

(52) U.S. Cl.
CPC .................................. *G01R 31/58* (2020.01)

(58) Field of Classification Search
CPC .............................. G01R 31/58; G01R 31/327
See application file for complete search history.

(56) References Cited

U.S. PATENT DOCUMENTS

| 6,181,139 B1 * | 1/2001 | Joergensen | ........ G01R 31/1272 |
| | | | 324/455 |
| 7,489,140 B1 * | 2/2009 | Butterworth | ........... G01R 31/59 |
| | | | 324/544 |

FOREIGN PATENT DOCUMENTS

| CN | 105425118 A | * | 3/2016 |
| CN | 106199310 A | | 12/2016 |

* cited by examiner

*Primary Examiner* — Feba Pothen

(57) ABSTRACT

A device for simulating intermittent arc grounding faults in a power distribution network includes a sliding rail, a first and a second support frames, an insulated electrode disk, and an electrode disk motor. The first support frame is fixed on the left side of the slide rail, and the position of the second support frame relative to the first support frame can be adjusted through the sliding rail. The second support frame is provided with an electrode disk motor for driving the insulated electrode disk to rotate. An upper and a lower conductive bars are installed on the first support frame, their adjacent ends provided with an upper and a lower arc-shaped conductor sheets, and the insulated electrode disk having two circles of conductive pillars is located between the conductor sheets. The conductor sheets are respectively installed on the side of the conductive bars close to the conductive pillar.

17 Claims, 2 Drawing Sheets

ARC CENTER

DEVICE AND METHOD FOR SIMULATING INTERMITTENT ARC GROUNDING FAULTS OF POWER DISTRIBUTION NETWORK

CROSS REFERENCE TO RELATED APPLICATIONS

The present application is a Continuation-In-Part Application of PCT Application No. PCT/CN2020/101994 filed on Jul. 15, 2020, which claims the benefit of Chinese Patent Application No. 202010001173.0 filed on Jan. 2, 2020. All the above are hereby incorporated by reference in their entirety.

FIELD

The disclosure relates to the technical field of power test of a power distribution network, in particular to a device and a method for simulating intermittent arc grounding faults of the power distribution network.

BACKGROUND

Affected by insulation breakdown, line aging, and bad weather such as storms, rainstorms, etc., medium-voltage distribution networks often have single-phase arc grounding faults due to breakage and falling to the ground of wires, flashover of insulators and the like. As one of the most common types of faults in medium-voltage distribution networks, single-phase arc grounding faults have the characteristics of complicated fault process, obvious nonlinearity, rich harmonics and the like. Under actual operating conditions on site and affected by temperature, humidity, wind speed and other conditions in the actual fault environment, the grounding process of arc grounding faults (especially high resistance grounding and low arc current) is often accompanied by intermittence, that is, the arc generated is unsteady arc. This type of arc is difficult to extinguish by itself, nor can it burn steadily. It is often extinguished when the power-frequency current crosses zero, forming a discharge phenomenon with burning and extinguishing in half or several cycles. For intermittent arc grounding that lasts for a long time and has a wide impact, it is easy to induce arc grounding overvoltage, which will damage the device and undermine the safe operation of the system.

In order to verify the electrical characteristics of single-phase arc grounding faults, obtain fault recording data, and verify the action behavior of various protective devices and distribution automation related devices, research teams of power grid companies and universities often need to carry out multiple repeatable artificial grounding experiments. In the artificial grounding experiment, the current commonly used method for stimulating arc grounding is to directly connect a copper ball gap to the power distribution line, and realize the arc discharge by adjusting the ball gap spacing. However, this method has the disadvantages of poor controllability, difficult to control the initial phase angle of discharge, and fragile ball gap. In addition, an intermittent grounding fault simulation device has been proposed in the invention patent application "Device and method for stimulation test of intermittent arc grounding faults of power distribution network" (Chinese Patent Application No.: 201610543564.9), which realizes discharge by a rotating electrode and a fixed conductive pillar. However, this device has the disadvantages of being expensive and difficult to achieve power-frequency arc extinguishing, etc., and is difficult to be popularized in artificial grounding experiments.

SUMMARY

In view of the above shortcomings in the art, the present disclosure combines the principle of arc extinguishing to provide a device and a method for simulating intermittent arc grounding faults in a power distribution network. The device and method can greatly reduce costs while effectively simulating the arc grounding faults and have a wide range of practical application values.

The technical scheme of the present disclosure is as follows.

A device for simulating intermittent arc grounding faults in a power distribution network includes a sliding rail, a first support frame, a second support frame, an insulated electrode disk, and an electrode disk motor. The first support frame is fixed on the left side of the slide rail, and the position of the second support frame relative to the first support frame can be adjusted through the sliding rail. The second support frame is provided with an electrode disk motor for driving the insulated electrode disk to rotate. An upper conductive bar and a lower conductive bar provided in a vertical state and spaced apart by a certain distance are installed on the first support frame. The adjacent ends of the upper conductive bar and the and lower conductive bar are respectively provided with an upper arc-shaped conductor sheet and a lower arc-shaped conductor sheet, and the insulated electrode disk is located between the upper arc-shaped conductor sheet and the lower arc-shaped conductor sheet. Two circles of conductive pillars are embedded on the insulated electrode disk. The conductive pillars of the outer circle are evenly distributed in the outer circle, and the conductive pillars of the inner circle are unevenly distributed in the inner circle. The upper arc-shaped conductor sheet and the lower arc-shaped conductor sheet are respectively installed on the side of the upper conductive bar and the lower conductive bar close to the conductive pillar.

Further, the motor shaft of the electrode disk motor is connected with a coupling, and the center of the insulated electrode disk is fixed with the coupling.

Further, the upper arc-shaped conductor sheet and the lower arc-shaped conductor sheet are connected with the upper conductive bar and the lower conductive bar by welding.

Further, the arc center of the upper arc-shaped conductor sheet and the lower arc-shaped conductor sheet overlaps with the vertical projection point of the center of the insulated electrode disk.

Further, the radii of the upper arc-shaped conductor sheet and the lower arc-shaped conductor sheet are the same as the radius of the circle where the conductive pillars of the outer circle are located.

Further, an upper support rod and a lower support rod are installed apart on the upper part of the first support frame, and the upper conductive bar and the lower conductive bar are respectively installed on the upper support rod and the lower support rod in a vertically movable manner.

Further, the upper conductive bar and the lower conductive bar are threaded into and fixed to the corresponding upper support rod and the lower support rod.

Further, the conductive pillars of two circles are arranged apart by 10 cm, the conductive pillars of the inner circle are 10 cm away from the center of the insulated electrode disk, and the conductive pillars of the outer circle are 5 cm away from the edge of the insulated electrode disk.

Further, the upper conductive bar is connected to the overhead phase line in the artificial grounding experiment, and the lower conductive bar is grounded.

A method for simulating intermittent arc grounding faults in a power distribution network performs the following based the above device:

a) when simulating stable arc grounding fault, the method includes: after completing line connection, rotate the insulated electrode disk 10 to select conductive pillars 12 of a certain outer circle or conductive pillars 11 of an inner circle, pull the second support frame 9 horizontally through the slide rail 1 so that the conductive pillar selected align vertically with the upper and lower conductive bars 5 and 6, fix the second support frame and do not turn on the electrode disk motor 14, so as to directly cause an arc grounding fault when energized;

b) when simulating intermittent arc grounding fault under incomplete arc extinguishing, the method includes: after completing the line connection, use the conductive pillars of the outer circle; under the condition of the experimental line frequency of fHz, turn on the electrode disk motor 14 to make the control target of rotating speed of the insulated electrode disk as 12f, and the unit is r/min; control the conductive pillars of the outer circle on the insulated electrode disk to rotate to the middle of the upper and lower conductive bars at the time of voltage peak, causing the arc grounding fault to occur in the system at the time of voltage peak; by dynamically adjusting the rotating speed of the electrode disk to 9f~12f, the arc extinguishing ability can be weakened;

c) when simulating the special conditions of multi-channel discharge such as breakdown of insulators and arresters under actual working conditions, the method includes: after completing the line connection, replace the upper and lower conductive bars and the arc-shaped conductor sheets, and adjusting the position of the second support frame 9 through the slide rail 1 to move the conductive pillars 11 of the inner circle to the middle of the upper and lower conductive bars; under the condition of the experimental line frequency of fHz, make the control target of the rotating speed of the insulated electrode disk as 12f, and the unit is r/min; the conductive pillars of the inner circle on the insulated electrode disk 10 rotate to the middle of the high voltage electrode and the ground electrode at the time of voltage peak, causing the arc grounding fault to occur in the system at the time of voltage peak.

Compared with the prior art, the present disclosure has the following beneficial effects.

1) There is no need to dynamically adjust the position of the conductive bar. The design idea of the existing device is that the position sensor on the support frame detects the relative position between the upper and lower conductive bars, and compares it with the real-time grid voltage waveform. By translationally adjusting the positions of the upper and lower conductive rods, the conductive pillar can be ensured to turn into the gap formed by the upper and lower conductive bars at around the time of the grid voltage peak in the positive and negative half cycles. By using the arc-shaped conductor sheets, the dischargeable area is enlarged. Therefore, it is possible to realize discharge of the conductive pillars to the arc-shaped conductor sheets without the need to monitor in real time the grid voltage or adjust the position of the upper and lower conductive bars. The design and manufacturing costs can be reduced.

2) The power-frequency zero-crossing arc extinguishing can be realized. When performing intermittent arc discharge by the existing device, due to the fast rotating speed of the insulated electrode disk and the short arc discharge time, high-frequency zero-crossing arc extinguishing of the current are mostly relied upon. By using the arc-shaped conductor sheets, the dischargeable area is enlarged. The electrical characteristics of power-frequency and high frequency arc extinguishing can be obtained by experiment at the same time, which is more practical.

3) The arc can be stabilized. When performing intermittent arc discharge by the existing device, due to the fast rotating speed of the insulated electrode disk, there are arcing phenomena of different degrees. The arc length changes too fast, and the arc is often not stable enough. By using the arc-shaped conductor sheets, the arc length can be kept substantially unchanged during the discharge process, which has the effect of stabilizing the arc and is safer.

4) Complicated conditions such as multi-channel discharge can be simulated. When conducting artificial grounding experiments with unevenly distributed conductive pillars of the inner circle, there is a possibility that multiple conductive pillars may turn to the middle of two arc-shaped conductor sheets at the time of the voltage peak, for the dischargeable area is enlarged by the arc-shaped conductor sheets. In this case, the multiple conductive pillars will break down at the same time to realize the discharge of multiple discharge channels. The special conditions of multi-channel discharge such as the breakdown of insulators and arresters under actual working conditions can be stimulated.

1—slide rail, 2—first support frame, 3—upper support rod, 4—lower support rod, 5—upper conductive bar, 6—lower conductive bar, 7—upper arc-shaped conductor sheet, 8—lower arc-shaped conductor sheet, 9—second support frame, 10—insulated electrode disk, 11—conductive pillar of the inner circle, 12—conductive pillar of the outer circle, 13—coupling, 14—electrode disk motor.

DETAILED DESCRIPTION

The technical solution of the present disclosure will be described clearly and completely in conjunction with the accompanying drawings in the following.

Figure 1:
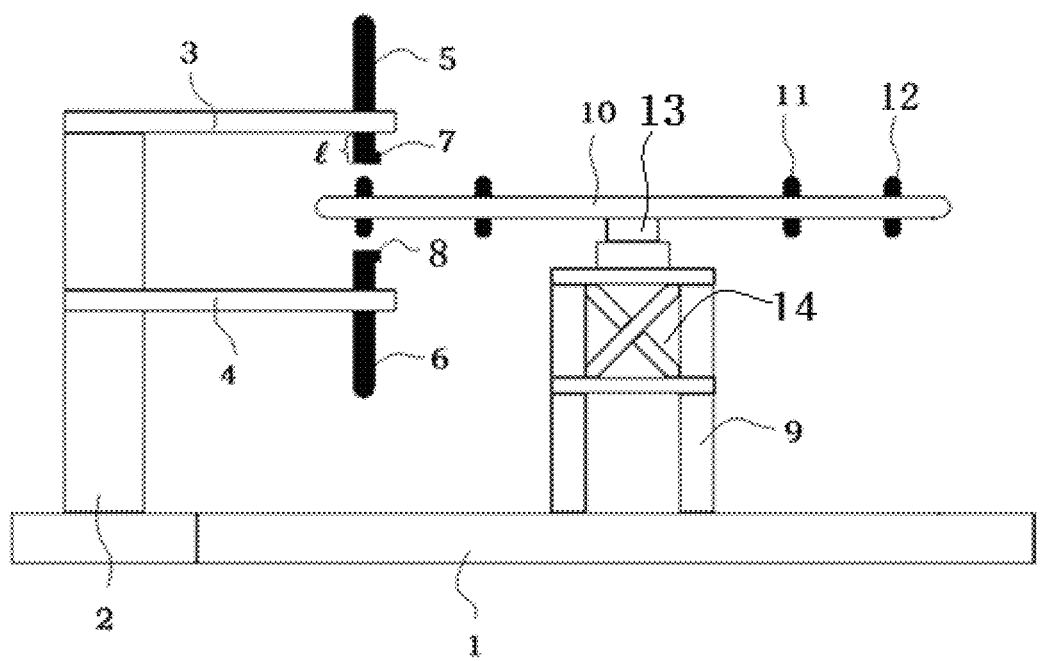
FIG. 1 is a structural schematic diagram of the device for simulating intermittent arc grounding faults in a power distribution network according to the present disclosure.
Figure 2:
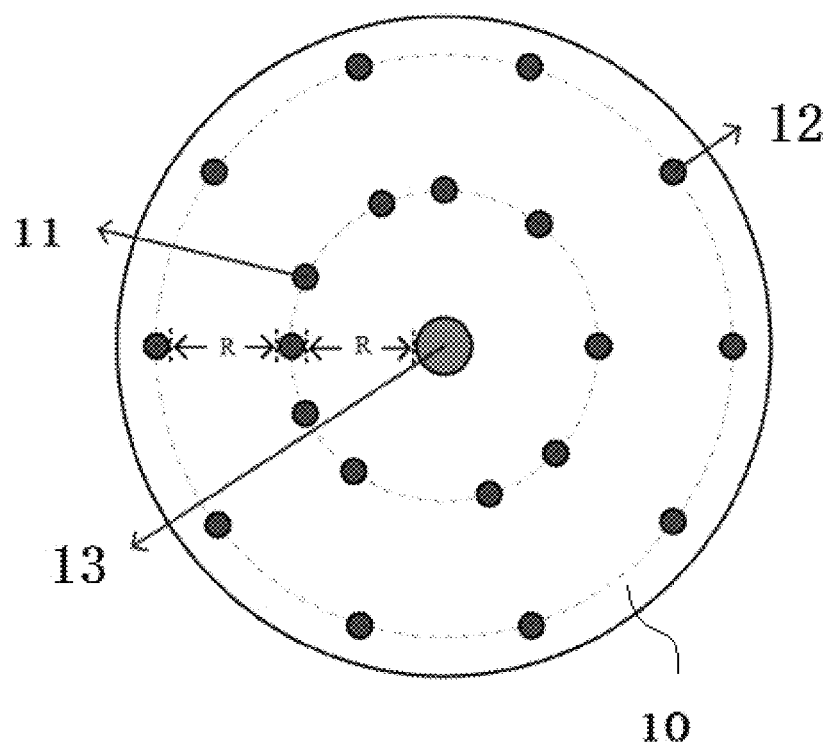
FIG. 2 is a schematic diagram of the insulated electrode disk and the distribution of the conductive pillars of the present disclosure.

Referring to FIG. 1, an embodiment of the present disclosure provides a device for simulating intermittent arc grounding faults in a power distribution network. The device includes a slide rail 1, a first support frame 2, an upper support rod 3, a lower support rod 4, an upper conductive bar 5, a lower conductive bar 6, an upper arc-shaped conductor sheet 7, a lower arc-shaped conductor sheet 8, a second support frame 9, an insulated electrode disk 10, conductive pillars 11 of the inner circle, conductive pillars 12 of the outer circle, a coupling 13, and an electrode disk motor 14.

The first support frame 2 is fixed on the left side of the slide rail 1. The upper support rod 3 and the lower support rod 4 are installed apart on the upper part of the first support frame 2. An upper conductive bar 5 and a lower conductive bar 6 are installed respectively on the upper support rod 3 and the lower support rod 4. The position of the second support frame 9 relative to the first support frame 2 can be adjusted through the slide rail 1. The second support frame 9 is provided with an electrode disk motor 14. The motor shaft of the electrode disk motor 14 is connected to the coupling 13. The center of the insulated electrode disk 10 is fixed with the coupling 13, and the insulated electrode disk 10 is a disk with a diameter of 55 cm.

Figure 3:
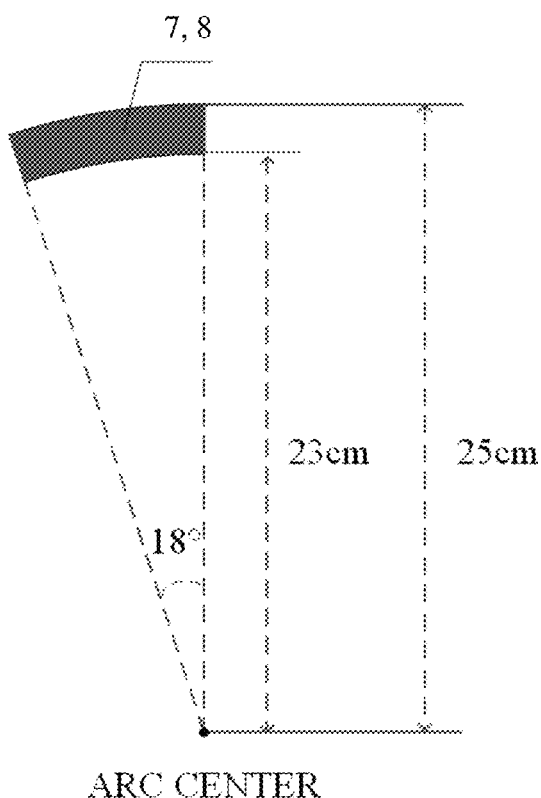
FIG. 3 is a schematic diagram of the structure and size of the arc-shaped conductor sheet of the present disclosure.
Figure 4:
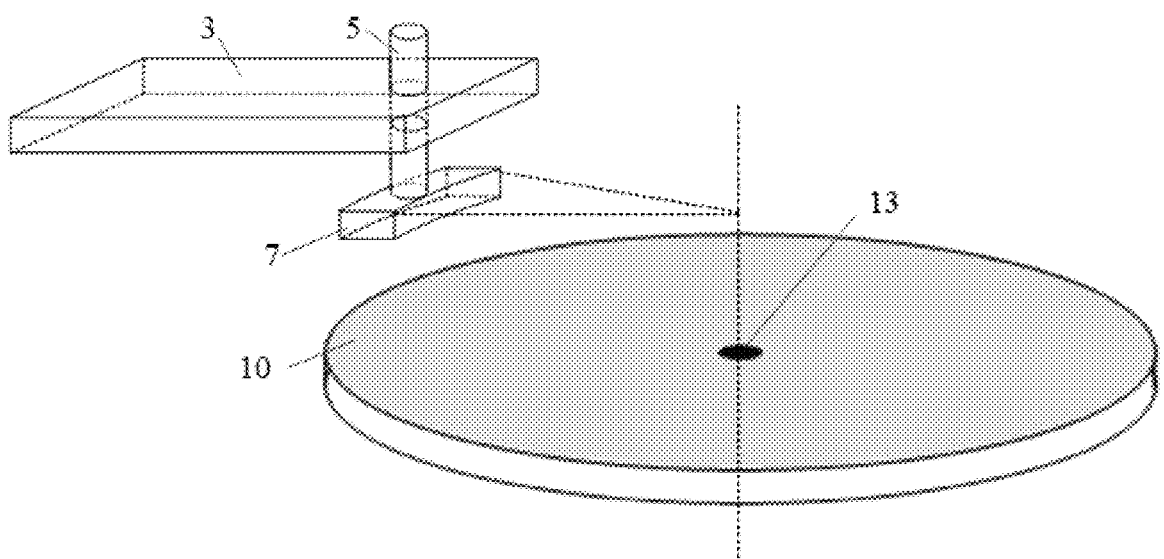
FIG. 4 shows the relative position of the arc-shaped conductor sheet and the insulated electrode disk.

The upper conductive bar 5 and the lower conductive bar 6 are arranged in a vertical state and are spaced apart by a certain distance. The lower end of the upper conductive bar 5 is provided with an upper arc-shaped conductor sheet 7, and the upper end of the lower conductive bar 6 is provided with a lower arc-shaped conductor sheet 8. The electrode disk 10 is located between the upper arc-shaped conductor sheet 7 and the lower arc-shaped conductor sheet 8. The upper arc-shaped conductor sheet 7 and the lower arc-shaped conductor sheet 8 can be connected to the upper conductive bar 5 and the lower conductive bar 6 by welding, and the welding point is located at the midpoint of the arc (as shown in FIG. 4). The upper arc-shaped conductor sheet 7 and the lower arc-shaped conductor sheet 8 can be designed to have the same shape, with an arc center angle of 18° and a radius of 20-25 cm (as shown in FIG. 3).

Two circles of conductive pillars are embedded onto the insulated electrode disk 10. A number (for example, 10) of conductive pillars 12 of the outer circle are evenly distributed in the outer circle, and a number (for example, 10) of conductive pillars 11 of the inner circle are unevenly distributed in the inner circle. The distance between the two circles of conductive pillars is 10 cm, the conductive pillars 11 of the inner circle are 10 cm away from the center of the circle, and the conductive pillars 12 of the outer circle are 5 cm away from the edge of the insulated electrode disk 10. The second support frame 9 can be pulled horizontally through the slide rail 1 to adjust its position, and is fixed by a metal buckle prior to selecting the circle of experimental conductive pillars.

The inner circle adopts the form of several unevenly distributed conductive pillars 11 of the inner circle, which can simulate multi-channel discharge. According to the existing parameter settings and device structure, the uniformly distributed conductive pillars 12 of the outer circle just correspond to each time of voltage peak when rotated, that is, there is one conductive pillar discharging at a time of voltage peak. Due to the existence of the arc-shaped conductor sheets 7 and 8, when the inner circle adopts the unevenly distributed conductive pillars 11 of the inner circle, there is the possibility that there are two conductive pillars between the two arc-shaped conductor sheets 7 and 8 at a time of voltage peak (of course, there may be no conductive pillars at the time of voltage peak), and the two conductive pillars will discharge at the same time, forming two discharge channels. This can better simulate the randomness of arc discharge, and there are indeed multi-channel discharges in practice.

The upper arc-shaped conductor sheet 7 and the lower arc-shaped conductor sheet 8 are arranged in parallel with the insulated electrode disk 10, and are respectively installed on the side of the upper conductive bar 5 and the lower conductive bar 6 close to the conductive pillars. The arc centers of the upper arc-shaped conductor sheet 7 and the lower arc-shaped conductor sheet 8 overlap with the vertical projection point of the center of the insulated electrode disk 10 (as shown in FIG. 4). The radii of the upper arc-shaped conductor sheet 7 and the lower arc-shaped conductor sheet 8 are the same as the radius of the circle where the conductive pillars 12 of the outer circle are located.

The upper conductive bar 5 and the lower conductive bar 6 can be made of brass and are about 30 cm long. They are threaded into and fixed to the corresponding upper support rod 3 and lower support rod 4. During the experimental preparation stage, the conductive bars 5 and 6 can be rotated to adjust their vertical protruding length, so as to adjust the discharge gap between the conductive pillars 11 and 12 and the arc-shaped conductor sheets 7 and 8.

Two circles of conductive pillars are embedded onto the insulated electrode disk 10 circumferentially. Ten outer conductive pillars 12 are evenly distributed on the outer circle, ten inner conductive pillars 11 are unevenly distributed on the inner circle, and the two circles of conductive pillars are spaced apart by 10 cm. The conductive pillars 11 of the inner circle are 10 cm away from center of the insulated electrode disk 10, and the circle conductive pillars 12 of the outer circle are 5 cm away from the edge of the insulated electrode disk 10. The second support frame 9 can be pulled horizontally to adjust its position through the slide rail 1, and is fixed by a metal buckle prior to selecting the conductive pillars of the outer circle or that of the inner circle as the circle of experimental conductive pillars. The upper conductive bar 5 is connected to the overhead phase line in the artificial grounding experiment, and the lower conductive bar 6 is grounded. During the experiment, the current flow path includes the overhead phase line, the upper conductive bar 5, the upper arc-shaped conductor sheet 7, the conductive pillar, the lower arc-shaped conductor sheet 8, the lower conductive bar 6, and the earth.

The insulated electrode disk 10 is driven by the electrode disk motor 14 to rotate. Any one of the conductive pillars on the insulated electrode disk 10 arcs when passing through the gap between the upper arc-shaped conductor sheet 7 and the lower arc-shaped conductor sheet 8, and the conductive pillar extinguishes as it turns away from the gap.

With the arc-shaped conductor sheets 7 and 8, and on condition that the voltage frequency of the experimental circuit is 50 Hz and the motor drives the insulated electrode disk 10 to rotate at a rotating speed of n, the controller controls the electrode disk motor 14 to rotate at the rotating speed of n=600 r/min with the pulse signal. By controlling the conductive pillars to turn into the gap between the upper and lower conductive bars 5 and 6 at around the time of phase voltage peak in positive and negative half-cycles to induce arc discharge, the phase characteristics of the conductive pillars are simulated experimentally. The time interval at which the conducive pillars are turned into the middle of the upper and lower conductive bars 5 and 6 is determined by controlling the rotating speed of the insulated electrode disk 10. In this way, the control of the arc discharge frequency is achieved. By controlling the rotating speed of the insulated electrode disk 10, it is possible to change the speed at which the arc is lengthened so as to change the arc extinguishing time. Further, it is also possible to stimulate, with the conductive pillars of the inner circle, the influence of different breakdown phases and rapid arc length changes on the electrical characteristics of the fault in a single fault.

With the arc-shaped conductor sheets 7 and 8 in the present disclosure, by controlling the conductive pillars to turn into the gap between the upper conductive bar 5 and the lower conductive bars 6 at around the time of phase voltage peak in positive and negative half-cycles to induce arc discharge, the phase characteristics of the conductive pillars are simulated experimentally. The time interval at which the conducive pillars are turned into the middle of the upper conductive bar 5 and the lower conductive bars 6 is determined by controlling the rotating speed of the insulated electrode disk 10. In this way, the control of the arc discharge frequency is achieved. By controlling the rotating speed of the insulated electrode disk 10, it is possible to change the speed at which the arc is lengthened so as to change the arc extinguishing time. Further, it is also possible to stimulate, with the conductive pillars 11 of the inner circle, the influence of different breakdown phases and rapid arc length changes on the electrical characteristics of the fault in a single fault.

The embodiment of the present disclosure also provides a method for simulating intermittent arc grounding faults in a power distribution network. The method is performed based on the above device for simulating intermittent arc grounding faults in a power distribution network. Since the arc-shaped conductor sheets 7 and 8 are indirectly connected to the test circuit via the conductive bars 5 and 6, when the insulated electrode disk 10 drives the conductive pillars 11 and 12 to turn into the area of the arc-shaped conductor sheets 7 and 8, discharge can occur. Since the arc discharge area is enlarged to the area of arc-shaped conductor sheets 7 and 8, the arc discharge time can be significantly extended, and the power-frequency arc extinguishing can be realized. The method specifically includes the following.

a) Simulation of stable arc grounding fault. After completing the line connection, rotate the insulated electrode disk 10 to select a certain conductive pillar 12 of the outer circle or a certain conductive pillar 11 of the inner circle, and pull the second support frame 9 horizontally through the slide rail 1 so that the conductive pillar selected align with the upper and lower conductive bars (5, 6) vertically, fix the second support frame and do not turn on the electrode disk motor 14, so as to directly cause an arc grounding fault when energized.

b) Simulation of intermittent arc grounding fault under incomplete arc extinguishing. After completing the line connection, use the conductive pillars 12 of the outer circle; under the condition of the experimental line frequency of f Hz, turn on the electrode disk motor 14 to make the rotating speed control target of the insulated electrode disk 10 as 12f, and the unit is r/min; control the conductive pillar 12 of the outer circle on the insulated electrode disk 10 to turn to the middle of the upper and lower conductive bars 5 and 6 at the time of the voltage peak, causing the arc grounding fault to occur in the system at the time of the voltage peak; by dynamically adjusting the rotating speed of the electrode disk to 9 f~12 f, the arc extinguishing ability can be weakened.

Controlling the conductive pillars 12 of the outer circle on the insulated electrode disk 10 to turn to the middle of the upper and lower conductive bars 5 and 6 at the time of the voltage peak can be achieved in the following way: a power-frequency 50 Hz (0.02 s), a rotating speed 600 r/min, one revolution corresponds to 0.1 s, and there are ten conductive pillars in one revolution. Therefore, a conductive pillar corresponds to 0.01 s, that is, half a power-frequency cycle, and every half power-frequency cycle has a time of the voltage peak.

Because of the existence of the arc-shaped conductor sheet (its arc central angle, etc., has been calculated to also correspond to half a power-frequency cycle), it is equivalent to enlarging the area of the upper and lower conductive bars, and discharge can be performed within range of the arc-shaped conductor sheets. There is no restriction that the conductive bars must be aligned with the conductive pillars to discharge.

c) Simulation of the special conditions of multi-channel discharge such as breakdown of insulators and arresters under actual working conditions. After completing the line connection, replace the upper and lower conductive bars 5 and 6 and the arc-shaped conductor sheets 7 and 8, and adjust the position of the second support frame 9 to turn the conductive pillars 11 of the inner circle to the middle of the upper and lower conductive bars 5 and 6. Under the condition of the experimental circuit frequency of f Hz, the control target of rotating speed of the insulated electrode disk 10 is 12 f, and the unit is r/min; the conductive pillars 11 of the inner circle on the insulated electrode disk 10 turn to the middle of the high voltage electrode and the ground electrode at the time of the voltage peak, causing the system to have an arc grounding fault at the time of the voltage peak.

The working modes of the simulation equipment of the intermittent ground fault of the distribution network and the methods to simulate the intermittent arc grounding fault of the distribution network mainly include the following five types.

1) Stable discharge. After completing the line connection, select a certain conductive pillar 12 of the outer circle or a certain conductive pillar 11 of the inner circle and fix it, do not turn on the electrode disk motor 14, but only adjust the relative position between the conductive pillar and the upper and lower conductive rods 5 and 6. This can simulate common non-intermittent stable arc grounding faults.

2) Bipolar discharge. Using the conductive pillars 12 of the outer circle, arc discharge occurs at around the time of the phase voltage peak in the positive and negative half-cycles. This is the most typical intermittent arc grounding and is realized by:

Step 1: The real arc simulation device calculates the control target of rotating speed of the electrode disk according to the set bipolar discharge mode. Under the condition of power-frequency 50 Hz, in order to ensure that the conductive pillars rotate between the upper and lower conductive bars 5 and 6 at around the time of the grid voltage peak, the rotating speed control target of the insulated electrode disk 10 is 600 r/min.

Step 2: Start the electrode disk motor 14, do not charge the upper and lower conductive bars 5 and 6 first, and after the rotating speed of the insulated electrode disk 10 stabilizes at 600 r/min, ensure that the conductive pillars turn into the middle of the gap formed by the upper and lower conductive bars 5 and 6 at around the time of the grid voltage peak in the positive and negative half-cycles.

Step 3: After the relative position between the conductive pillars and the upper and lower conductive bars 5 and 6 is stabilized for a period of time, power on and the test starts.

In the bipolar discharge mode, the speed of the insulated electrode disk 10 is relatively fast. However, due to the existence of the arc-shaped conductor sheets, in some experimental environments, the electrical characteristics of the arc power-frequency and high frequency extinguishing can both be obtained at the same time after each arc discharge.

3) Unipolar discharge. The conductive pillars 12 of the outer circle are used to trigger arc discharge when the phase voltage is near the peak of the positive half cycle or the peak of the negative half cycle. The specific operation steps are similar to the bipolar discharge, except that the rotating speed of the insulated electrode disk 10 is adjusted to half of that in the bipolar discharge mode, namely 300 r/min. In the unipolar discharge mode, after each arc discharge, the arc is usually extinguished after a high-frequency or power-frequency zero-crossing point.

4) Arc discharge under incomplete arc extinguishing. The conductive pillars 12 of the outer circle are used. The conductive pillars on the insulated electrode disk 10 rotate to the middle of the high-voltage electrode and the ground electrode at the time of the voltage peak, causing the system to have an arc grounding fault at the time of the voltage peak. By dynamically adjusting the rotating speed of the insulated electrode disk 10, the arc extinguishing ability of the arc is weakened, so as to generate the arc grounding phenomenon under incomplete arc extinguishing. This phenomenon is different from the stable power-frequency stream arc, and has the features that the arc current reaches the maximum value when the discharge occurs, and then the oscillation attenuates but is not completely extinguished.

5) Arc discharge affected by complicated conditions relating to arc length and breakdown phase. Replace the conductive bar and the arc-shaped conductor sheet, adjust the position of the second support frame 9 to move the conductive pillars 11 of inner circle to the middle of the upper and lower conductive bars. The operation steps are similar to that of the bipolar discharge. At this time, the control target of rotating speed of the electrode disk is 600 r/min. The special conditions of multi-channel discharge such as breakdown of insulators and arresters under actual working conditions can be stimulated.

In the above simulation methods, the stable discharge corresponds to the simulation of stable arc grounding fault, the bipolar/unipolar discharge corresponds to the simple intermittent arc grounding fault, and the arc discharge under incomplete arc extinguishing corresponds to the stimulation of intermittent arc grounding fault under incomplete arc extinguishing; the arc discharge affected by complicated conditions relating to arc length and breakdown phase corresponds to the stimulation of the special conditions of multi-channel discharge such as breakdown of insulators and arresters under actual working conditions.

In the present disclosure, the upper conductive bar 5 is connected to the phase line, and the lower conductive bar 6 is grounded in the artificial grounding experiment. By controlling the conductive pillars 11 and 12 on the insulated electrode disk 10 to turn to the gap between the arc-shaped conductor sheets 7 and 8 at the time of the phase voltage in the upper and lower half-cycles, arc discharge is induced to simulate the phase characteristics experimentally. By controlling the rotating speed of the insulated electrode disk 10 to determine the time interval for the conductive pillars 11 and 12 to turn into the middle of the upper and lower conductive bars 5 and 6, the control of the arc discharge frequency is realized. In addition, the influence of different breakdown phases and rapid arc length changes on the electrical characteristics of the fault in a single fault can also be simulated with the conductive pillars 11 of inner circle. The use of arc-shaped conductor sheets 7 and 8 in the present disclosure can greatly reduce costs while realizing power-frequency arc extinguishing and effectively simulating arc grounding faults, and has a wide range of practical application values.

The above are only specific embodiments of the present disclosure, but the protection scope of the present disclosure is not limited to this. The changes or substitutions that can be easily envisaged by any person skilled in the art within the technical scope disclosed by the present disclosure should be covered within the protection scope of the present disclosure.

What is claimed is that:

1. A device for simulating intermittent arc grounding faults of a power distribution network, comprising: a sliding rail (1), a first support frame (2), a second support frame (9), an insulated electrode disk (10), and an electrode disk motor (14); the first support frame (2) is fixed on a left side of the slide rail (1), and a position of the second support frame (9) relative to the first support frame (2) can be adjusted through the sliding rail (1); the second support frame (9) is provided with the electrode disk motor (14) for driving the insulated electrode disk (10) to rotate, an upper conductive bar (5) and a lower conductive bar (6) provided in a vertical state and spaced apart by a certain distance are installed on the first support frame (2), adjacent ends of the upper conductive bar (5) and lower conductive bar (6) are respectively provided with an upper arc-shaped conductor sheet (7) and a lower arc-shaped conductor sheet (8), and the insulated electrode disk (10) are located between the upper arc-shaped conductor sheet (7) and the lower arc-shaped conductor sheet (8); two circles of conductive pillars are embedded on the insulated electrode disk (10), the two circles of conductive pillars comprise an inner circle of conductive pillars (11) and an outer circle of conductive pillars (12), the conductive pillars (12) of the outer circle are evenly distributed in the outer circle, and the conductive pillars (11) of the inner circle are unevenly distributed in the inner circle; the upper arc-shaped conductor sheet (7) and the lower arc-shaped conductor sheet (8) are respectively installed on a side of the upper conductive bar (5) and the lower conductive bar (6) close to the conductive pillars.

2. The device of claim 1, wherein a motor shaft of the electrode disk motor (14) is connected with a coupling (13), and a center of the insulated electrode disk (10) is fixed with the coupling (13).

3. The device of claim 1, wherein the upper arc-shaped conductor sheet (7) and the lower arc-shaped conductor sheet (8) are connected with the upper conductive bar (5) and the lower conductive bar (6) by welding.

4. The device of claim 1, wherein an arc center of the upper arc-shaped conductor sheet (7) and lower arc-shaped conductor sheet (8) overlaps with a vertical projection point of a center of the insulated electrode disk (10).

5. The device of claim 1, wherein radii of the upper arc-shaped conductor sheet (7) and the lower arc-shaped conductor sheet (8) are the same as a radius of the circle where the conductive pillars (12) of the outer circle are located.

6. The device of claim 1, wherein an upper support rod (3) and a lower support rod (4) are installed apart on an upper part of the first support frame (2), and the upper conductive bar (5) and the lower conductive bar (6) are respectively installed on the upper support rod (3) and the lower support rod (4) in a vertically movable manner.

7. The device of claim 6, wherein the upper conductive bar (5) and the lower conductive bar (6) are threaded into and fixed to a corresponding one of the upper support rod (3) and the lower support rod (4).

8. The device of claim 1, wherein the two circles of the conductive pillars are arranged apart by 10 cm, the conductive pillars (11) of the inner circle are 10 cm away from a center of the insulated electrode disk (10), and the conductive pillars (12) of the outer circle are 5 cm away from an edge of the insulated electrode disk (10).

9. The device of claim 1, wherein the upper conductive bar (5) is connected to an overhead phase line in an artificial grounding experiment, and the lower conductive bar (6) is grounded.

10. A method for simulating intermittent arc grounding faults in a power distribution network, wherein the followings are performed based on the device of claim 1:
   a) when simulating stable arc grounding fault, the method comprises: after completing line connection, rotate the insulated electrode disk (10) to select a certain conductive pillar (12) of the outer circle or a certain conductive pillar (11) of the inner circle, pull the second support frame (9) horizontally through the slide rail (1) so that the certain conductive pillar selected align vertically with the upper and lower conductive bars (5, 6), fix the second support frame and do not turn on the electrode disk motor (14), so as to directly cause an arc grounding fault when energized;
   b) when simulating intermittent arc grounding fault under incomplete arc extinguishing, the method comprises: after completing the line connection, use the conductive pillars (12) of the outer circle; under the condition of the experimental line frequency of f Hz, turn on the electrode disk motor (14) to make a control target of rotating speed of the insulated electrode disk (10) as 12f having a unit of revolutions per minute, r/min; control the conductive pillar (12) of the outer circle on the insulated electrode disk (10) to turn to the middle of the upper and lower conductive bars (5, 6) at a time of voltage peak, causing the arc grounding fault to occur in the system at the time of voltage peak; by dynamically adjusting the rotating speed of the electrode disk to 9f~12f, an arc extinguishing ability can be weakened;
   c) when simulating the special conditions of multi-channel discharge under actual working conditions, the multi-channel discharge comprises breakdown of insulators and arresters, and the method comprises: after completing the line connection, replace the upper and lower conductive bars (5, 6) and the arc-shaped conductor sheets (7, 8), and adjusting the position of the second support frame (9) through the slide rail (1) to move the conductive pillar (11) of the inner circle to the middle of the upper and lower conductive bars (5, 6); under the condition of the experimental line frequency of f Hz, make the control target of the rotating speed of the insulated electrode disk (10) as 12f having the unit of revolutions per minute, r/min; the conductive pillar (11) of the inner circle on the insulated electrode disk (10) turns to the middle of the upper and lower conductive bars (5, 6) at the time of voltage peak, causing the arc grounding fault to occur in the system at the time of voltage peak.

11. A method for simulating intermittent arc grounding faults in a power distribution network, wherein the followings are performed based on the device of claim 2:
   a) when simulating stable arc grounding fault, the method comprises: after completing line connection, rotate the insulated electrode disk (10) to select a certain conductive pillar (12) of the outer circle or a certain conductive pillar (11) of the inner circle, pull the second support frame (9) horizontally through the slide rail (1) so that the certain conductive pillar selected align vertically with the upper and lower conductive bars (5, 6), fix the second support frame and do not turn on the electrode disk motor (14), so as to directly cause an arc grounding fault when energized;
   b) when simulating intermittent arc grounding fault under incomplete arc extinguishing, the method comprises: after completing the line connection, use the conductive pillars (12) of the outer circle; under the condition of the experimental line frequency of f Hz, turn on the electrode disk motor (14) to make a control target of rotating speed of the insulated electrode disk (10) as 12f having a unit of revolutions per minute, r/min; control the conductive pillar (12) of the outer circle on the insulated electrode disk (10) to turn to the middle of the upper and lower conductive bars (5, 6) at a time of voltage peak, causing the arc grounding fault to occur in the system at the time of voltage peak; by dynamically adjusting the rotating speed of the electrode disk to 9f~12f, an arc extinguishing ability can be weakened;
   c) when simulating the special conditions of multi-channel discharge under actual working conditions, the multi-channel discharge comprises breakdown of insulators and arresters, and the method comprises: after completing the line connection, replace the upper and lower conductive bars (5, 6) and the arc-shaped conductor sheets (7, 8), and adjusting the position of the second support frame (9) through the slide rail (1) to move the conductive pillar (11) of the inner circle to the middle of the upper and lower conductive bars (5, 6); under the condition of the experimental line frequency of f Hz, make the control target of the rotating speed of the insulated electrode disk (10) as 12f having the unit of revolutions per minute, r/min; the conductive pillar (11) of the inner circle on the insulated electrode disk (10) turns to the middle of the upper and lower conductive bars (5, 6) at the time of voltage peak, causing the arc grounding fault to occur in the system at the time of voltage peak.

12. A method for simulating intermittent arc grounding faults in a power distribution network, wherein the followings are performed based on the device of claim 3:
   a) when simulating stable arc grounding fault, the method comprises: after completing line connection, rotate the insulated electrode disk (10) to select a certain conductive pillar (12) of the outer circle or a certain conductive pillar (11) of the inner circle, pull the second support frame (9) horizontally through the slide rail (1) so that the certain conductive pillar selected align vertically with the upper and lower conductive bars (5, 6), fix the second support frame and do not turn on the electrode disk motor (14), so as to directly cause an arc grounding fault when energized;
   b) when simulating intermittent arc grounding fault under incomplete arc extinguishing, the method comprises: after completing the line connection, use the conductive pillars (12) of the outer circle; under the condition of the experimental line frequency of f Hz, turn on the electrode disk motor (14) to make a control target of rotating speed of the insulated electrode disk (10) as 12f having a unit of revolutions per minute, r/min; control the conductive pillar (12) of the outer circle on the insulated electrode disk (10) to turn to the middle of the upper and lower conductive bars (5, 6) at a time of voltage peak, causing the arc grounding fault to occur in the system at the time of voltage peak; by dynamically adjusting the rotating speed of the electrode disk to 9f~12f, an arc extinguishing ability can be weakened;
   c) when simulating the special conditions of multi-channel discharge under actual working conditions, the multi-channel discharge comprises breakdown of insulators and arresters, and the method comprises: after completing the line connection, replace the upper and lower conductive bars (5, 6) and the arc-shaped conductor sheets (7, 8), and adjusting the position of the second support frame (9) through the slide rail (1) to move the conductive pillar (11) of the inner circle to the middle of the upper and lower conductive bars (5, 6); under the condition of the experimental line frequency of f Hz, make the control target of the rotating speed of the insulated electrode disk (10) as 12f having the unit of revolutions per minute, r/min; the conductive pillar (11) of the inner circle on the insulated electrode disk (10) turns to the middle of the upper and lower conductive bars (5, 6) at the time of voltage peak, causing the arc grounding fault to occur in the system at the time of voltage peak.

13. A method for simulating intermittent arc grounding faults in a power distribution network, wherein the followings are performed based on the device of claim 4:
 a) when simulating stable arc grounding fault, the method comprises: after completing line connection, rotate the insulated electrode disk (10) to select a certain conductive pillar (12) of the outer circle or a certain conductive pillar (11) of the inner circle, pull the second support frame (9) horizontally through the slide rail (1) so that the certain conductive pillar selected align vertically with the upper and lower conductive bars (5, 6), fix the second support frame and do not turn on the electrode disk motor (14), so as to directly cause an arc grounding fault when energized;
 b) when simulating intermittent arc grounding fault under incomplete arc extinguishing, the method comprises: after completing the line connection, use the conductive pillars (12) of the outer circle; under the condition of the experimental line frequency of f Hz, turn on the electrode disk motor (14) to make a control target of rotating speed of the insulated electrode disk (10) as 12f having a unit of revolutions per minute, r/min; control the conductive pillar (12) of the outer circle on the insulated electrode disk (10) to turn to the middle of the upper and lower conductive bars (5, 6) at a time of voltage peak, causing the arc grounding fault to occur in the system at the time of voltage peak; by dynamically adjusting the rotating speed of the electrode disk to 9f~12f, an arc extinguishing ability can be weakened;
 c) when simulating the special conditions of multi-channel discharge under actual working conditions, the multi-channel discharge comprises breakdown of insulators and arresters, and the method comprises: after completing the line connection, replace the upper and lower conductive bars (5, 6) and the arc-shaped conductor sheets (7, 8), and adjusting the position of the second support frame (9) through the slide rail (1) to move the conductive pillar (11) of the inner circle to the middle of the upper and lower conductive bars (5, 6); under the condition of the experimental line frequency of f Hz, make the control target of the rotating speed of the insulated electrode disk (10) as 12f having the unit of revolutions per minute, r/min; the conductive pillar (11) of the inner circle on the insulated electrode disk (10) turns to the middle of the upper and lower conductive bars (5, 6) at the time of voltage peak, causing the arc grounding fault to occur in the system at the time of voltage peak.

14. A method for simulating intermittent arc grounding faults in a power distribution network, wherein the followings are performed based on the device of claim 5:
 a) when simulating stable arc grounding fault, the method comprises: after completing line connection, rotate the insulated electrode disk (10) to select a certain conductive pillar (12) of the outer circle or a certain conductive pillar (11) of the inner circle, pull the second support frame (9) horizontally through the slide rail (1) so that the certain conductive pillar selected align vertically with the upper and lower conductive bars (5, 6), fix the second support frame and do not turn on the electrode disk motor (14), so as to directly cause an arc grounding fault when energized;
 b) when simulating intermittent arc grounding fault under incomplete arc extinguishing, the method comprises: after completing the line connection, use the conductive pillars (12) of the outer circle; under the condition of the experimental line frequency of f Hz, turn on the electrode disk motor (14) to make a control target of rotating speed of the insulated electrode disk (10) as 12f having a unit of revolutions per minute, r/min; control the conductive pillar (12) of the outer circle on the insulated electrode disk (10) to turn to the middle of the upper and lower conductive bars (5, 6) at a time of voltage peak, causing the arc grounding fault to occur in the system at the time of voltage peak; by dynamically adjusting the rotating speed of the electrode disk to 9f~12f, an arc extinguishing ability can be weakened;
 c) when simulating the special conditions of multi-channel discharge under actual working conditions, the multi-channel discharge comprises breakdown of insulators and arresters, and the method comprises: after completing the line connection, replace the upper and lower conductive bars (5, 6) and the arc-shaped conductor sheets (7, 8), and adjusting the position of the second support frame (9) through the slide rail (1) to move the conductive pillar (11) of the inner circle to the middle of the upper and lower conductive bars (5, 6); under the condition of the experimental line frequency of f Hz, make the control target of the rotating speed of the insulated electrode disk (10) as 12f having the unit of revolutions per minute, r/min; the conductive pillar (11) of the inner circle on the insulated electrode disk (10) turns to the middle of the upper and lower conductive bars (5, 6) at the time of voltage peak, causing the arc grounding fault to occur in the system at the time of voltage peak.

15. A method for simulating intermittent arc grounding faults in a power distribution network, wherein the followings are performed based on the device of claim 6:
 a) when simulating stable arc grounding fault, the method comprises: after completing line connection, rotate the insulated electrode disk (10) to select a certain conductive pillar (12) of the outer circle or a certain conductive pillar (11) of the inner circle, pull the second support frame (9) horizontally through the slide rail (1) so that the certain conductive pillar selected align vertically with the upper and lower conductive bars (5, 6), fix the second support frame and do not turn on the electrode disk motor (14), so as to directly cause an arc grounding fault when energized;
 b) when simulating intermittent arc grounding fault under incomplete arc extinguishing, the method comprises: after completing the line connection, use the conductive pillars (12) of the outer circle; under the condition of the experimental line frequency of f Hz, turn on the electrode disk motor (14) to make a control target of rotating speed of the insulated electrode disk (10) as 12f having a unit of revolutions per minute, r/min; control the conductive pillar (12) of the outer circle on the insulated electrode disk (10) to turn to the middle of the upper and lower conductive bars (5, 6) at a time of voltage peak, causing the arc grounding fault to occur in the system at the time of voltage peak; by dynamically adjusting the rotating speed of the electrode disk to 9f~12f, an arc extinguishing ability can be weakened;

c) when simulating the special conditions of multi-channel discharge under actual working conditions, the multi-channel discharge comprises breakdown of insulators and arresters, and the method comprises: after completing the line connection, replace the upper and lower conductive bars (5, 6) and the arc-shaped conductor sheets (7, 8), and adjusting the position of the second support frame (9) through the slide rail (1) to move the conductive pillar (11) of the inner circle to the middle of the upper and lower conductive bars (5, 6); under the condition of the experimental line frequency of f Hz, make the control target of the rotating speed of the insulated electrode disk (10) as 12f having the unit of revolutions per minute, r/min; the conductive pillar (11) of the inner circle on the insulated electrode disk (10) turns to the middle of the upper and lower conductive bars (5, 6) at the time of voltage peak, causing the arc grounding fault to occur in the system at the time of voltage peak.

16. A method for simulating intermittent arc grounding faults in a power distribution network, wherein the followings are performed based on the device of claim 7:

a) when simulating stable arc grounding fault, the method comprises: after completing line connection, rotate the insulated electrode disk (10) to select a certain conductive pillar (12) of the outer circle or a certain conductive pillar (11) of the inner circle, pull the second support frame (9) horizontally through the slide rail (1) so that the certain conductive pillar selected align vertically with the upper and lower conductive bars (5, 6), fix the second support frame and do not turn on the electrode disk motor (14), so as to directly cause an arc grounding fault when energized;

b) when simulating intermittent arc grounding fault under incomplete arc extinguishing, the method comprises: after completing the line connection, use the conductive pillars (12) of the outer circle; under the condition of the experimental line frequency of f Hz, turn on the electrode disk motor (14) to make a control target of rotating speed of the insulated electrode disk (10) as 12f having a unit of revolutions per minute, r/min; control the conductive pillar (12) of the outer circle on the insulated electrode disk (10) to turn to the middle of the upper and lower conductive bars (5, 6) at a time of voltage peak, causing the arc grounding fault to occur in the system at the time of voltage peak; by dynamically adjusting the rotating speed of the electrode disk to 9f~12f, an arc extinguishing ability can be weakened;

c) when simulating the special conditions of multi-channel discharge under actual working conditions, the multi-channel discharge comprises breakdown of insulators and arresters, and the method comprises: after completing the line connection, replace the upper and lower conductive bars (5, 6) and the arc-shaped conductor sheets (7, 8), and adjusting the position of the second support frame (9) through the slide rail (1) to move the conductive pillar (11) of the inner circle to the middle of the upper and lower conductive bars (5, 6); under the condition of the experimental line frequency of f Hz, make the control target of the rotating speed of the insulated electrode disk (10) as 12f having the unit of revolutions per minute, r/min; the conductive pillar (11) of the inner circle on the insulated electrode disk (10) turns to the middle of the upper and lower conductive bars (5, 6) at the time of voltage peak, causing the arc grounding fault to occur in the system at the time of voltage peak.

17. A method for simulating intermittent arc grounding faults in a power distribution network, wherein the followings are performed based on the device of claim 8:

a) when simulating stable arc grounding fault, the method comprises: after completing line connection, rotate the insulated electrode disk (10) to select a certain conductive pillar (12) of the outer circle or a certain conductive pillar (11) of the inner circle, pull the second support frame (9) horizontally through the slide rail (1) so that the certain conductive pillar selected align vertically with the upper and lower conductive bars (5, 6), fix the second support frame and do not turn on the electrode disk motor (14), so as to directly cause an arc grounding fault when energized;

b) when simulating intermittent arc grounding fault under incomplete arc extinguishing, the method comprises: after completing the line connection, use the conductive pillars (12) of the outer circle; under the condition of the experimental line frequency of f Hz, turn on the electrode disk motor (14) to make a control target of rotating speed of the insulated electrode disk (10) as 12f having a unit of revolutions per minute, r/min; control the conductive pillar (12) of the outer circle on the insulated electrode disk (10) to turn to the middle of the upper and lower conductive bars (5, 6) at a time of voltage peak, causing the arc grounding fault to occur in the system at the time of voltage peak; by dynamically adjusting the rotating speed of the electrode disk to 9f~12f, an arc extinguishing ability can be weakened;

c) when simulating the special conditions of multi-channel discharge under actual working conditions, the multi-channel discharge comprises breakdown of insulators and arresters, and the method comprises: after completing the line connection, replace the upper and lower conductive bars (5, 6) and the arc-shaped conductor sheets (7, 8), and adjusting the position of the second support frame (9) through the slide rail (1) to move the conductive pillar (11) of the inner circle to the middle of the upper and lower conductive bars (5, 6); under the condition of the experimental line frequency of f Hz, make the control target of the rotating speed of the insulated electrode disk (10) as 12f having the unit of revolutions per minute, r/min; the conductive pillar (11) of the inner circle on the insulated electrode disk (10) turns to the middle of the upper and lower conductive bars (5, 6) at the time of voltage peak, causing the arc grounding fault to occur in the system at the time of voltage peak.

* * * * *